(12) United States Patent  
Yun-Ho et al.

(10) Patent No.: US 6,739,144 B2  
(45) Date of Patent: May 25, 2004

(54) EMI REDUCING STRUCTURE IN REFRIGERATOR

(75) Inventors: Kim Yun-Ho, Changwon (KR); Lee Ik-Kyu, Changwon (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/319,684

(22) Filed: Dec. 16, 2002

(65) Prior Publication Data

US 2003/0121272 A1 Jul. 3, 2003

(30) Foreign Application Priority Data

Dec. 19, 2001 (KR) ................. 10-2001-0081467

(51) Int. Cl.[7] ............................................. F25B 49/00
(52) U.S. Cl. ........................................ 62/125; 62/331
(58) Field of Search ........................ 62/125, 331, 440; 340/585

(56) References Cited

U.S. PATENT DOCUMENTS 5,963,680 A * 10/1999 Kleinerman ................. 385/12
6,566,973 B2 * 5/2003 Schumacher ................. 333/12

* cited by examiner

Primary Examiner—Marc Norman  
(74) Attorney, Agent, or Firm—Fleshner & Kim, LLP

(57) ABSTRACT

The present invention relates to an EMI reducing structure in a refrigerator. The present invention aims at minimizing electromagnetic waves radiated from a cable 60 for transmitting signals from a control unit 40 installed in a main body 20 of the refrigerator to a display unit 30 installed on a door 22. To this end, it is configured such that the cable 60 composed of a bundle of cables is put into a conductive shielding net 70 which in turn is connected to grounding portions 40g, 30g of the control unit 40 and display unit 30. At this time, both ends of the conductive shielding net 70 are fully connected to the grounding portions 40g, 30g, respectively. Further, the cable 60 wrapped with the conductive shielding net 70 is installed within a waveguide 50. In general, the waveguide 50 functions to shield electromagnetic waves of a high frequency band greater than a cut-off frequency varying according to its sectional shape. According to the present invention, the electromagnetic waves radiated from the refrigerator can be minimized.

5 Claims, 2 Drawing Sheets

FIG 1.
Conventional
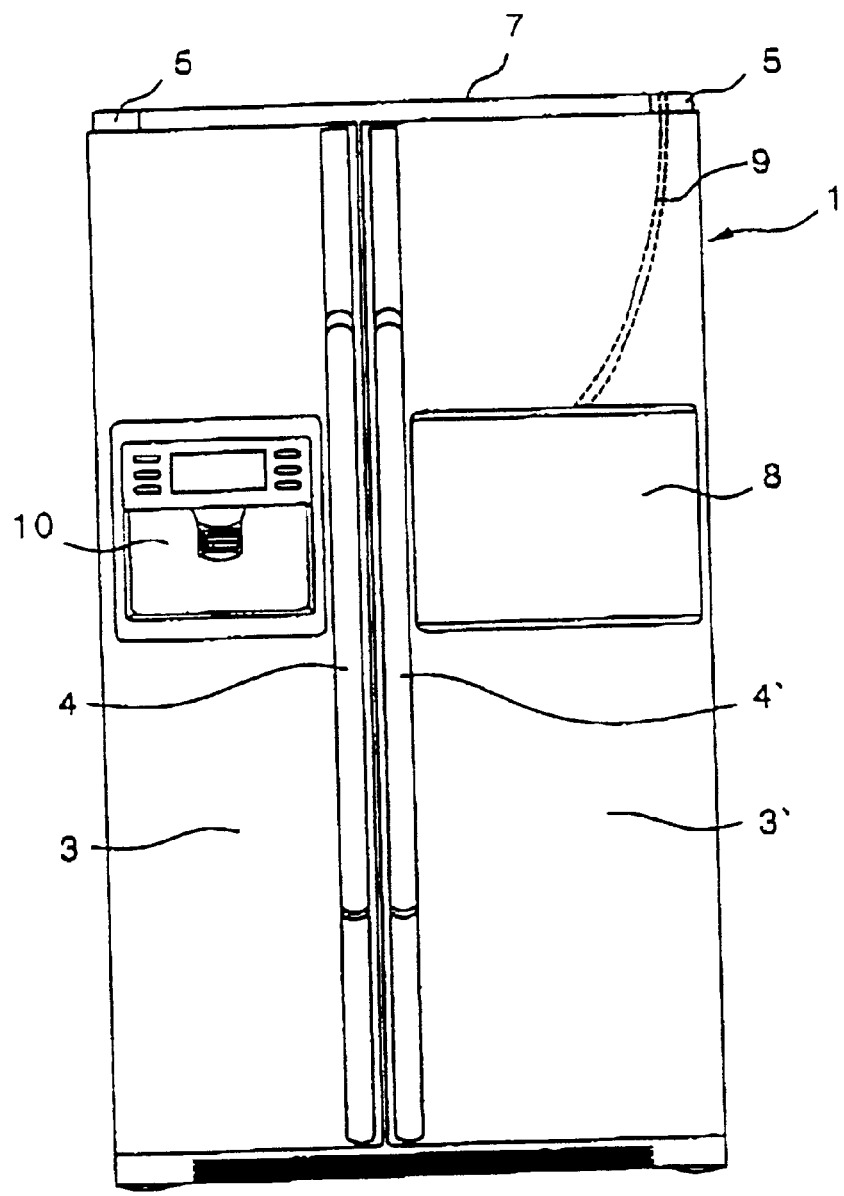

FIG 2.
Conventional
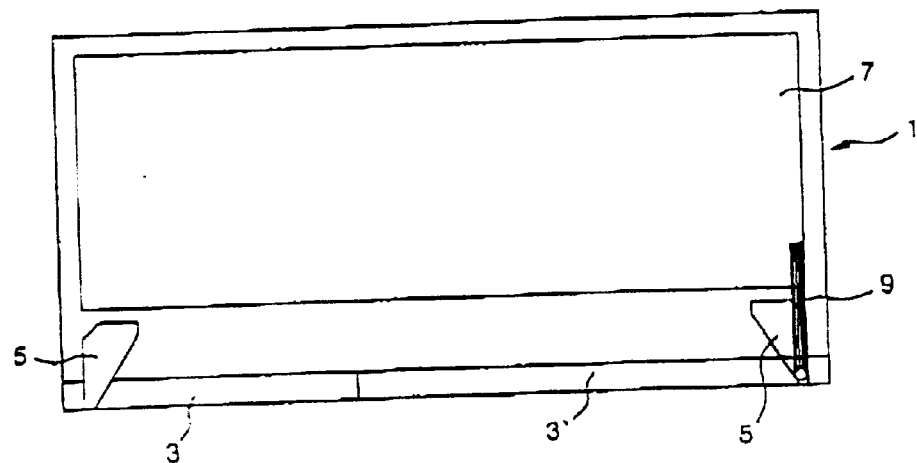

US 6,739,144 B2

EMI REDUCING STRUCTURE IN REFRIGERATOR

BACKGROUND OF THE INVENTION

1. Field of the Invention

The present invention relates to a refrigerator, and more particularly, to an electromagnetic interference (EMI) reducing structure in an Internet refrigerator for allowing electromagnetic waves generated from the refrigerator to be minimized.

2. Description of the Prior Art

FIG. 1 is a front view showing an external structure of a conventional refrigerator, and FIG. 2 is a plan view showing a top structure of the conventional refrigerator.

As shown in the figures, a storage space is defined in the refrigerator 1, and the storage space is selectively opened and closed by doors 3, 3'. The doors 3, 3' are provided with door handles 4, 4', respectively. The doors 3, 3' are opened and closed on the pivot of hinge portions 5, 5', respectively. Each of the hinge portions 5, 5' is connected to an upper end of each of the doors 3, 3' and becomes a center of pivot upon opening and closing of each of the doors. Other hinge portions (not shown) are also provided at lower ends of the doors 3, 3' so that the doors 3, 3' can be supported and the pivot thereof can also be guided.

Further, a control unit 7 is provided on the top of the refrigerator 1. An external appearance of the control unit 7 is defined by a control unit cover, and various kinds of components and circuit boards are installed within the control unit 7. The components installed within the control unit include parts for controlling an inherent function of the refrigerator and parts for performing an Internet related function as a home networking server, For example, the components include a digital controller, LCD control related parts, TV receiving related parts, CCD camera module related parts, speakers, a microphone, and the like.

In addition, a display unit 8 is provided at the door 3'. The display unit 8 is an LCD screen and causes a variety of information such as an Internet homepage to be displayed thereon. The display unit 8 and the control unit 7 are connected with each other through a cable 9.

Herein, the cable 9 is connected to the board provided in the control unit 7 through an I/O connector of the board and led out through a side of the control unit cover. The cable 9 led out through the side of the control unit cover is inserted into and through the hinge portion 5' and then connected to the interior of the door 3'. The cable 9 is also connected to an I/O terminal of the display unit 8 installed in the interior of the door 3'. Reference numeral 10 denotes a dispenser.

In the conventional refrigerator constructed as such, a variety of information such as the Internet homepage are displayed on the display unit 8 so that a user can connect with the Internet and implement home networking.

However, there are the following problems in the prior art.

In addition to the parts for performing the inherent function of the refrigerator, the components required for the Internet and home networking are installed within the Internet refrigerator. Therefore, the electromagnetic waves are produced too much, and thus, electromagnetic interference (EMI) due to electromagnetic waves becomes an issue.

Nonetheless, in the conventional refrigerator, any measures for shielding the electromagnetic waves are not provided to the cable 9 that connects the control unit 7 and the display unit 8. Thus, there is a problem in that the electromagnetic waves are fully radiated therefrom. Particularly, it is difficult to provide a structure for shielding the electromagnetic waves to the conventional configuration in which the cable 9 extends from the control unit cover to the hinge portion 5'.

SUMMARY OF THE INVENTION

Accordingly, the present invention is contemplated to solve the above problems in the prior art. An object of the present invention is to minimize electromagnetic waves radiated from a refrigerator.

According to an aspect of the present invention for accomplishing the object, there is provided an EMI reducing structure in a refrigerator, which comprises a main body of the refrigerator in which a storage space is defined and doors for selectively opening and closing the storage space are installed, a control unit installed at one side of the main body of the refrigerator for controlling an operation of the refrigerator, a display unit installed at a front surface of one of the doors for displaying a variety of information thereon, a waveguide installed such that it passes through the interior of the main body of the refrigerator, its inlet communicates with the control unit, and its outlet faces a back surface of the door, a cable which passes through the interior of the waveguide to make signal connection between the control unit and the display unit, and a conductive shielding net wrapped around an entire outer surface of the cable.

Preferably, one end of the conductive shielding net is electrically connected to a grounding portion of the control unit and the other end thereof is also electrically connected to a grounding portion of the display unit.

Further, the ends of the conductive shielding net may be fully connected to come into contact with the grounding portions.

More preferably, the conductive shielding net is flexible to come into close contact with an outer surface of the cable composed of a bundle of cables.

Furthermore, the waveguide may be installed within an insulating layer of the main body of the refrigerator.

According to the EMI reducing structure in the refrigerator constructed as such, there is an advantage in that the electromagnetic waves, which are radiated from the cable used for connecting the control unit installed in the main body of the refrigerator and the display unit installed on the door, can be minimized.

BRIEF DESCRIPTION OF THE DRAWINGS

The above and other objects and features of the present invention will become apparent from the following description of a preferred embodiment given in conjunction with the accompanying drawings, in which:

FIG. 1 is a front view showing an external structure of a conventional refrigerator;

FIG. 2 is a plan view showing a top structure of the conventional refrigerator;

FIG. 4 is a partial perspective view showing a state where a cable is installed within a waveguide according to the preferred embodiment of the present invention;

FIG. 5 is a conceptual view of the EMI reducing structure of the present invention;

FIG. 6a is a graph plotting EMI characteristics according to a prior art; and

FIG. 6b is a graph plotting EMI characteristics according to the present invention.

DETAILED DESCRIPTION OF THE PREFERRED EMBODIMENTS

Figure 3:
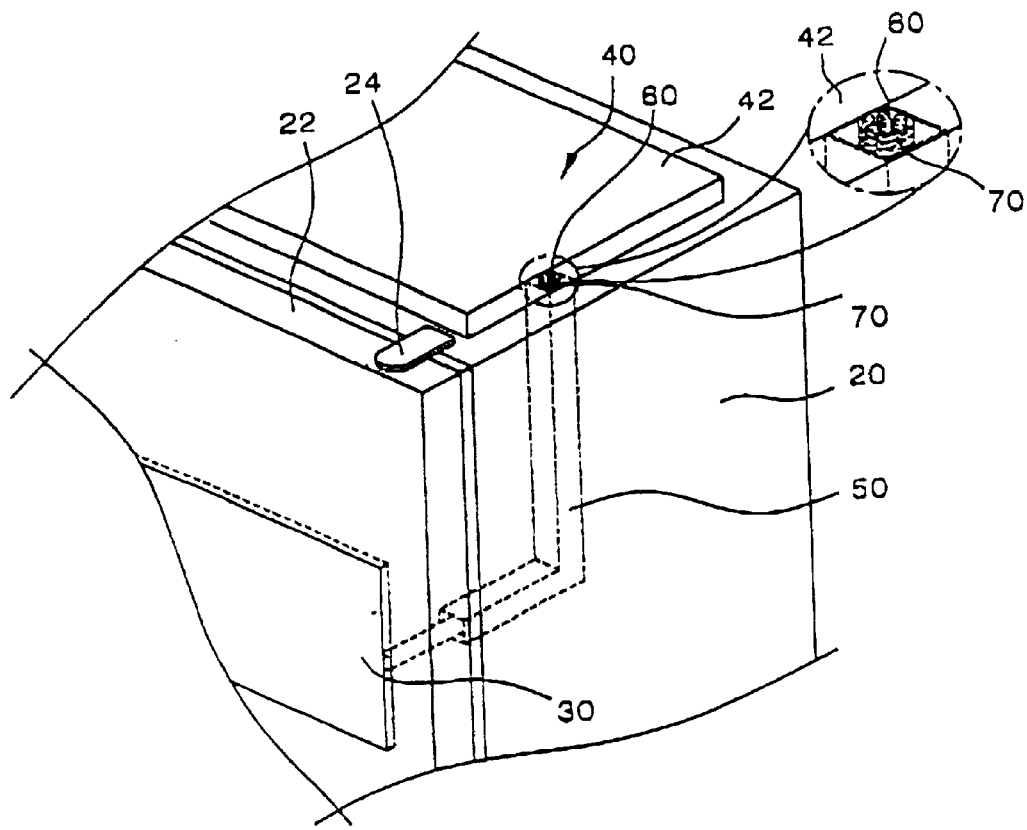
FIG. 3 is a partial perspective view of an EMI reducing structure in a refrigerator according to a preferred embodiment of the present invention.

Hereinafter, a preferred embodiment of an electromagnetic interference (EMI) reducing structure in a refrigerator according to the present invention will be explained in detail with reference to the accompanying drawings.

FIG. 3 shows a partial perspective view of the EMI reducing structure in the refrigerator according to the preferred embodiment of the present invention, FIG. 4 is a partial perspective view showing a state where a cable is installed within a waveguide according to the preferred embodiment of the present invention, and FIG. 5 is a conceptual view of the EMI reducing structure according to the present invention.

As shown in the figures, a door 22 for selectively opening and closing a storage space defined within a main body 20 of the refrigerator is installed at a front face of the main body 20 of the refrigerator. The door 22 is pivoted on a hinge portion 24.

On a front surface of the door 22 is installed a display unit 30 onto which information on home networking and a variety of information related to the operation of the refrigerator are in turn displayed.

At the top of the main body 20 of the refrigerator is installed a control unit 40 in which circuit boards, parts for controlling an inherent storage function of the refrigerator, and home networking components are in turn provided. The control unit 40 is covered with a control unit cover 42 that defines an external appearance of the control unit 40.

Furthermore, a waveguide 50 is installed in such a manner that one end thereof is in communication with the interior of the control unit 40, i.e. a space covered with the control unit cover 42, and another end thereof is in communication with the front face of the main body 20 of the refrigerator. In other words, an inlet of the waveguide 50 is bored into the top of the main body 20 of the refrigerator to be open to the space defined by the control unit cover 42, and an outlet of the waveguide 50 is open to the front face of the main body 20 of the refrigerator to face one side of the door 22. Herein, the door 22 facing the outlet of the waveguide 50 is provided with a through-hole through which a cable 60 to be described later passes, so that the through-hole is formed to extend up to an I/O terminal of the display unit 30.

It is preferred that the waveguide 50 be made of a metallic material. Further, the waveguide is installed within an insulating layer formed in the main body 20 of the refrigerator. Although it has been described in the preferred embodiment of the present invention that the waveguide 50 is configured to be in the form of a "L" shape, the present invention is not necessarily limited thereto and can also vary depending on design conditions of the refrigerator. In addition, although it has been described in the preferred embodiment that the waveguide 50 is rectangular in view of its sectional shape, the present invention is not necessarily limited thereto.

The waveguide 50 generally cuts off the electromagnetic waves in a high frequency band, and its cutoff frequency is determined according to its sectional shape, and more specifically to a major axis length a and a minor axis length b of the section and is expressed as the following equation:

$$f_c = \frac{1}{2\pi\sqrt{\mu\varepsilon}} \sqrt{\left(\frac{m\pi}{a}\right)^2 + \left(\frac{n\pi}{b}\right)^2} \quad (1)$$

As seen from the above equation, a cutoff frequency of a waveguide with a rectangular section is determined as a function of a major axis length a and a minor axis length b.

The cable 60 is also installed within the waveguide 50. The cable 60 connects the control unit 40 and the display unit 30 so that they can transmit and receive electrical signals to and from each other. The cable 60 is configured such that a plurality of cables are tied into a bundle. A conductive shielding net 70 is wrapped around the bundle of the cables. The conductive shielding net 70 is weaved with a conductive wire and made in the form of an elastic net. Thus, the conductive shielding net 70 causes the plurality of cables to be wrapped into one bundle of cables to come into close contact with an outer surface of the bundle of cables.

In addition, both ends of the conductive shielding net 70 are connected to grounding portions 40g, 30g of the control unit 40 and the display unit 30, respectively, as shown in FIG. 5. At this time, the ends of the conductive shielding net 70 are fully connected to the grounding portions 40g, 30g without any gaps therebetween. Further, it is configured such that any electrical potential difference should not be generated between the both ends of the conductive shielding net 70. Thus, the conductive shielding net 70 can shield the cable 60 so that the electromagnetic waves generated from the cable 60 cannot be radiated to the outside.

An operation of the EMI reducing structure in the refrigerator of the present invention constructed as such will be hereinafter described.

The waveguide 50 is installed within the insulating layer of the main body 20 of the refrigerator. Further, the inlet of the waveguide 50 communicates with the interior space defined by the control unit cover 42 of the control unit 40, and the outlet of the waveguide 50 is directed to a predetermined position on a back surface of the door 22.

Then, the cable 60 wrapped with the conductive shielding net 70 passes through the interior of the waveguide 50. At this time, both the ends of the conductive shielding net 70 are electrically connected to the grounding portions 40g, 30g of the control unit 40 and the display unit 30, respectively.

In particular, when the conductive shielding net 70 is caused to connect with the grounding portions 40g, 30g, the ends of the conductive shielding net 70 should be fully connected to the grounding portions 40g, 30g so that the electrical potential difference cannot be generated. This is to prevent the cable 60 with the conductive shielding net 70 wrapped therearond from functioning as an antenna for radiating the electromagnetic waves therefrom. Further, since the whole ends of the conductive shielding net 70 come into close contact with the grounding portions 40g, 30g, respectively, without any gaps therebetween, the physical gaps through which the electromagnetic waves are leaked also become relatively small.

According to the present invention, the electromagnetic waves are shielded by the waveguide 50 and the conductive shielding net 70. In particular, the waveguide 50 shields the electromagnetic waves in the high frequency band, whereas the conductive shielding net 70 shields the electromagnetic waves in a relatively lower frequency band.

First, the sectional shape of the waveguide 50 is determined according to electromagnetic waves radiation characteristics of the parts installed within the control unit 40. This is because limits of transmittable frequency can be determined according to the sectional shape of the waveguide 50. At this time, the limit frequency is called a cutoff frequency. In addition, a wavelength corresponding to the cutoff frequency is called a cutoff wavelength. Therefore, the electromagnetic waves of a frequency greater than the cutoff frequency can propagate through the waveguide 50, whereas the electromagnetic waves of a frequency lower than the cutoff frequency cannot be transmitted. Thus, the waveguide 50 functions as a kind of high-pass filter.

Further, both the ends of the conductive shielding net 70 are fully connected to come into contact with the grounding portions 40g, 30g, respectively, and thus the electrical potential difference is not produced therefrom. Therefore, the conductive shielding net 70 also functions to prevent outward radiation of the electromagnetic waves generated from the cable 60.

In the meantime, FIGS. 6a and 6b are graphs plotting test results of electromagnetic waves radiation characteristics. Herein, FIGS. 6a and 6b show the electromagnetic waves radiation characteristics according to the prior art and the present invention, respectively. As can be understood from these figures, the electromagnetic waves shielding characteristics according to the present invention are remarkably superior to those of the prior art.

As described in detail above, the EMI reducing structure in the refrigerator according to the present invention is configured in such a manner that the cable for connecting the control unit and the display unit is put into the conductive shielding net and then placed into the waveguide.

Therefore, the waveguide causes the electromagnetic waves in the high frequency band not to be radiated, and the conductive shielding net causes the electromagnetic waves generated from the cable not to be transmitted to the outside. Accordingly, there is an advantage in that the electromagnetic waves generated from the refrigerator can be minimized.

Although the preferred embodiment of the present invention has been described for illustrative purposes, the present invention is not limited to the particular embodiment. It will be apparent to those skilled in the art that various changes or modifications may be made thereto within the scope of the invention defined by the appended claims.

What is claimed is:

1. An EMI reducing structure in a refrigerator, comprising:
    a main body of the refrigerator in which a storage space is defined and doors for selectively opening and closing the storage space are installed;
    a control unit installed at one side of the main body of the refrigerator for controlling an operation of the refrigerator;
    a display unit installed at a front surface of one of the doors for displaying a variety of information thereon;
    a waveguide installed such that it passes through the interior of the main body of the refrigerator, its inlet communicates with the control unit, and its outlet faces a back surface of the door;
    a cable which passes through the interior of the waveguide to make signal connection between the control unit and the display unit; and
    a conductive shielding net wrapped around an entire outer surface of the cable.

2. The structure as claimed in claim 1, wherein one end of the conductive shielding net is electrically connected to a grounding portion of the control unit and the other end thereof is also electrically connected to a grounding portion of the display unit.

3. The structure as claimed in claim 2, wherein the ends of the conductive shielding net are fully connected to come into contact with the grounding portions.

4. The structure as claimed in claim 1, wherein the conductive shielding net is flexible to come into close contact with an outer surface of the cable composed of a bundle of cables.

5. The structure as claimed in claim 1, wherein the waveguide is installed within an insulating layer of the main body of the refrigerator.

* * * * *